United States Patent
Cremers

(10) Patent No.: US 10,701,294 B1
(45) Date of Patent: Jun. 30, 2020

(54) LOCAL PIXEL DRIVER CIRCUITRY

(71) Applicant: SEMICONDUCTOR COMPONENTS INDUSTRIES, LLC, Phoenix, AZ (US)

(72) Inventor: Bart Cremers, Zonhoven (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/238,070

(22) Filed: Jan. 2, 2019

(51) Int. Cl.
*H04N 5/359* (2011.01)
*H01L 27/146* (2006.01)
*H04N 5/353* (2011.01)

(52) U.S. Cl.
CPC ..... *H04N 5/3591* (2013.01); *H01L 27/14654* (2013.01); *H04N 5/353* (2013.01)

(58) Field of Classification Search
CPC . H04N 5/3591; H04N 5/353; H01L 27/14654
See application file for complete search history.

(56) References Cited

U.S. PATENT DOCUMENTS

| | | | |
|---|---|---|---|
| 7,456,887 B2* | 11/2008 | Zhao | H04N 5/363 |
| | | | 250/208.1 |
| 9,848,141 B2* | 12/2017 | Panicacci | H04N 5/3592 |
| 2002/0122125 A1 | 9/2002 | TeWinkle | |
| 2007/0076109 A1 | 4/2007 | Krymski | |
| 2012/0188422 A1 | 7/2012 | Cho | |
| 2013/0187027 A1 | 7/2013 | Qiao | |
| 2014/0211056 A1 | 7/2014 | Fan | |

\* cited by examiner

*Primary Examiner* — Padma Haliyur
(74) *Attorney, Agent, or Firm* — Treyz Law Group, P.C.; Jason Tsai

(57) ABSTRACT

An image sensor may include an array of image sensor pixels. Each image sensor pixel in the array may be a global shutter pixel that includes first transistors and second transistors that are substantially larger than the first transistors. The second transistors may receive row control signals from peripheral row drivers formed at the edge of the array. Each pixel may further include local driver circuits interposed between the peripheral row drivers and the second transistors. Each local driver circuit may include a pull-down transistor for driving a row control signal low and a pull-up transistor for driving the row control signal high. Each local driver may optionally be shared among two or more adjacent pixels in a given row. The local drivers help reduce the total capacitive loading at the output of the peripheral row drivers and can therefore help improve row driver performance and minimize integration time.

20 Claims, 8 Drawing Sheets

LOCAL PIXEL DRIVER CIRCUITRY

BACKGROUND

This relates generally to imaging devices, and more particularly, to image sensors that include row drivers.

Image sensors are commonly used in electronic devices such as cellular telephones, cameras, and computers to capture images. In a typical arrangement, an electronic device is provided with an array of image pixels arranged in pixel rows and pixel columns. Each image pixel in the array includes a photodiode that is coupled to a floating diffusion region via a transfer gate. Column circuitry is coupled to each pixel column for reading out pixel signals from the image pixels. Row control circuitry is coupled to each pixel row for resetting, initiating charge transfer, or selectively activating a particular row of pixels for readout.

Machine-vision and other high-speed imaging applications demand global shutter operation with strict exposure control requirements. Depending on lighting conditions, minimizing the integration time is necessary in order to reduce motion artifacts and motion blur. Image sensors supporting global shutter operation typically include imaging pixels each having a photodiode, an anti-blooming transistor for selectively draining the photodiode, a first charge transfer transistor for selectively coupling the photodiode to a storage gate, a second charge transfer transistor for selectively coupling the storage gate to a floating diffusion region, a reset transistor for selectively resetting the floating diffusion region, and associated readout transistors.

The anti-blooming transistor and the first charge transfer transistor are often much larger devices than the reset and readout transistors. As a result, these bigger devices collectively present a large capacitive loading on the respective row control lines. The row driver circuitry have to drive these row control lines with large loading capacitance, which severely limits the performance of the image sensor.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

DETAILED DESCRIPTION

Embodiments of the present invention relate to image sensors. It will be recognized by one skilled in the art that the present exemplary embodiments may be practiced without some or all of these specific details. In other instances, well-known operations have not been described in detail in order not to unnecessarily obscure the present embodiments.

Electronic devices such as digital cameras, computers, cellular telephones, and other electronic devices may include image sensors that gather incoming light to capture an image. The image sensors may include arrays of pixels. The pixels in the image sensors may include photosensitive elements such as photodiodes that convert the incoming light into image signals. Image sensors may have any number of pixels (e.g., hundreds or thousands or more). A typical image sensor may, for example, have hundreds or thousands or millions of pixels (e.g., megapixels). Image sensors may include control circuitry such as circuitry for operating the pixels and readout circuitry for reading out image signals corresponding to the electric charge generated by the photosensitive elements.

Figure 1:
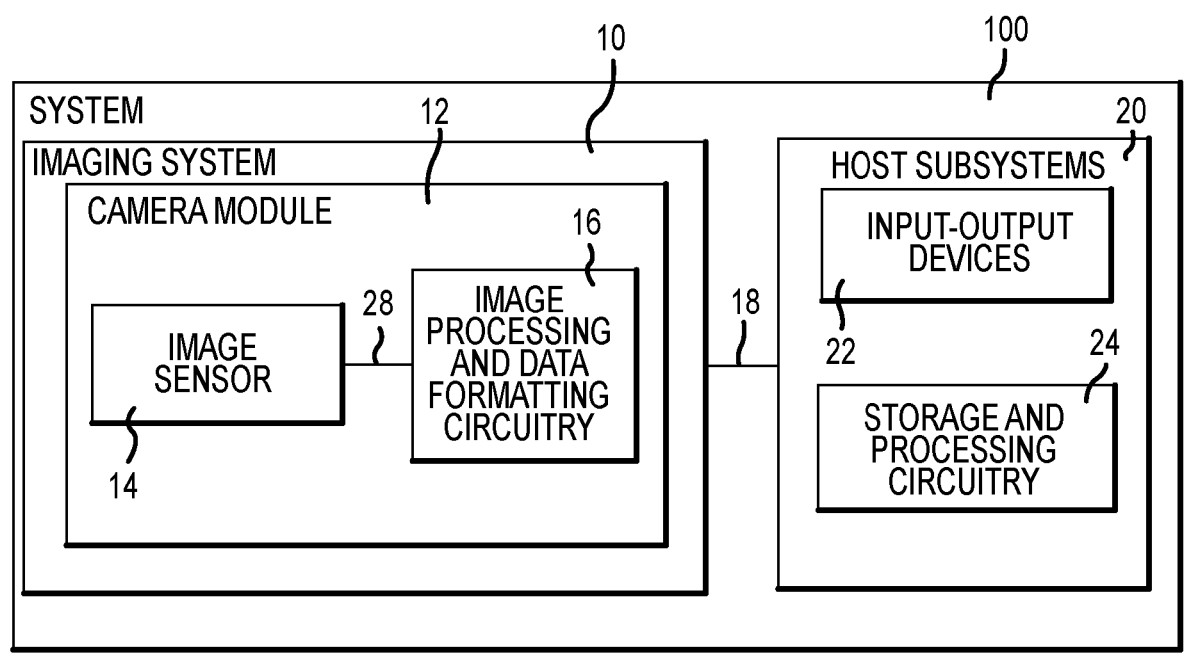
FIG. 1 is a diagram of an illustrative electronic device having an image sensor in accordance with an embodiment.

FIG. 1 is a diagram of an illustrative imaging and response system including an imaging system that uses an image sensor to capture images. System 100 of FIG. 1 may be an electronic device such as a camera, a cellular telephone, a video camera, or other electronic device that captures digital image data, may be a vehicle safety system (e.g., an active braking system or other vehicle safety system), or may be a surveillance system.

As shown in FIG. 1, system 100 may include an imaging system such as imaging system 10 and host subsystems such as host subsystem 20. Imaging system 10 may include camera module 12. Camera module 12 may include one or more image sensors 14 and one or more lenses.

Each image sensor in camera module 12 may be identical or there may be different types of image sensors in a given image sensor array integrated circuit. During image capture operations, each lens may focus light onto an associated image sensor 14. Image sensor 14 may include photosensitive elements (i.e., pixels) that convert the light into digital data. Image sensors may have any number of pixels (e.g., hundreds, thousands, millions, or more). A typical image sensor may, for example, have millions of pixels (e.g., megapixels). As examples, image sensor 14 may include bias circuitry (e.g., source follower load circuits), sample and hold circuitry, correlated double sampling (CDS) circuitry, amplifier circuitry, analog-to-digital converter circuitry, data output circuitry, memory (e.g., buffer circuitry), address circuitry, etc.

Still and video image data from camera sensor 14 may be provided to image processing and data formatting circuitry 16 via path 28. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip (SoC) arrangement, camera sensor 14 and image processing and data formatting circuitry 16 are implemented on a common semiconductor substrate (e.g., a common silicon image sensor integrated circuit die). If desired, camera sensor 14 and image processing circuitry 16 may be formed on separate semiconductor substrates. For example, camera sensor 14 and image processing circuitry 16 may be formed on separate substrates that have been stacked.

Imaging system 10 (e.g., image processing and data formatting circuitry 16) may convey acquired image data to host subsystem 20 over path 18. Host subsystem 20 may include processing software for detecting objects in images, detecting motion of objects between image frames, determining distances to objects in images, filtering or otherwise processing images provided by imaging system 10.

If desired, system 100 may provide a user with numerous high-level functions. In a computer or advanced cellular telephone, for example, a user may be provided with the ability to run user applications. To implement these functions, host subsystem 20 of system 100 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid-state drives, etc.). Storage and processing circuitry 24 may also include microprocessors, microcontrollers, digital signal processors, application specific integrated circuits, etc.

Figure 2:
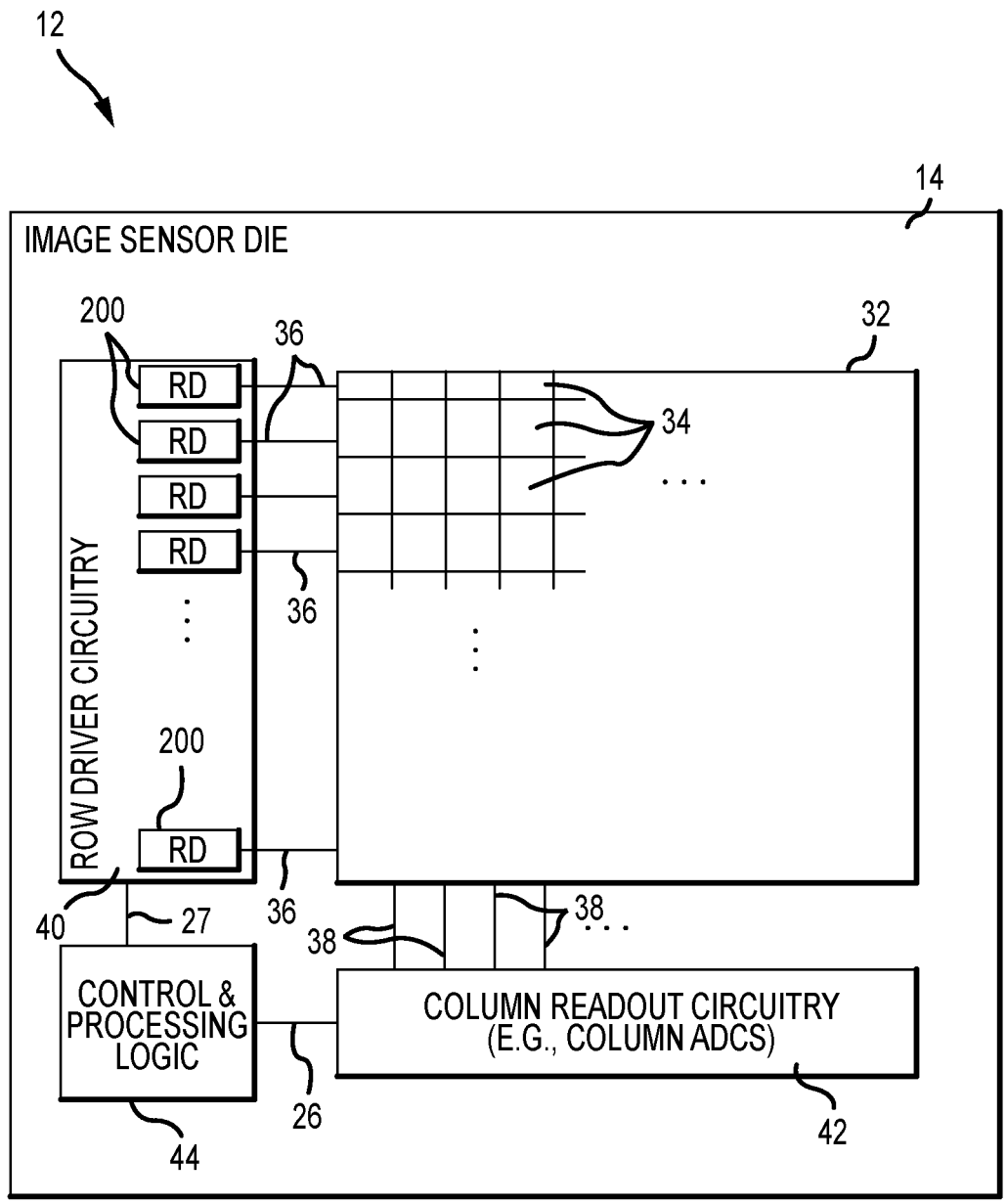
FIG. 2 is a diagram of an illustrative pixel array and associated row and column control circuitry for reading out image signals from an image sensor in accordance with an embodiment.

An example of an arrangement for camera module 12 of FIG. 1 is shown in FIG. 2. As shown in FIG. 2, camera module 12 includes image sensor 14 and control and processing circuitry 44. Control and processing circuitry 44 (sometimes referred to as control and processing logic) may correspond to image processing and data formatting circuitry 16 in FIG. 1. Image sensor 14 may include a pixel array such as array 32 of pixels 34 (sometimes referred to herein as image sensor pixels, imaging pixels, or image pixels 34). Control and processing circuitry 44 may be coupled to row control circuitry 40 via control path 27 and may be coupled to column control and readout circuits 42 via data path 26.

Row control circuitry 40 may receive row addresses from control and processing circuitry 44 and may supply corresponding row control signals to image pixels 34 over control paths 36 (e.g., pixel reset control signals, charge transfer control signals, blooming control signals, row select control signals, dual conversion gain control signals, or any other desired pixel control signals). Row control circuitry 40 includes individual row driver circuits 200 configured to generate these row control signals for each row of pixels and is therefore sometimes referred to as row driver circuitry. Although FIG. 2 shows only one row driver circuit 200 in a given row, each pixel row may actually include multiple row driver circuits each of which is responsible for generating a different row control signal (e.g., a reset control signal, a transfer control signal, a blooming control signal, a row select signal, etc.).

Column control and readout circuitry 42 may be coupled to the columns of pixel array 32 via one or more conductive lines such as column lines 38. Column lines 38 may be coupled to each column of image pixels 34 in image pixel array 32 (e.g., each column of pixels may be coupled to a corresponding column line 38). Column lines 38 may be used for reading out image signals from image pixels 34 and for supplying bias signals (e.g., bias currents or bias voltages) to image pixels 34. During image pixel readout operations, a pixel row in image pixel array 32 may be selected using row driver circuitry 40 and image data associated with image pixels 34 of that pixel row may be read out by column readout circuitry 42 on column lines 38. Column readout circuitry 42 may include column circuitry such as column amplifiers for amplifying signals read out from array 32, sample and hold circuitry for sampling and storing signals read out from array 32, analog-to-digital converter circuits for converting read out analog signals to corresponding digital signals, and column memory for storing the read out signals and any other desired data. Column control and readout circuitry 42 may output digital pixel readout values to control and processing logic 44 over line 26.

Array 32 may have any number of rows and columns. In general, the size of array 32 and the number of rows and columns in array 32 will depend on the particular implementation of image sensor 14. While rows and columns are generally described herein as being horizontal and vertical, respectively, rows and columns may refer to any grid-like structure (e.g., features described herein as rows may be arranged vertically and features described herein as columns may be arranged horizontally).

Figure 3:
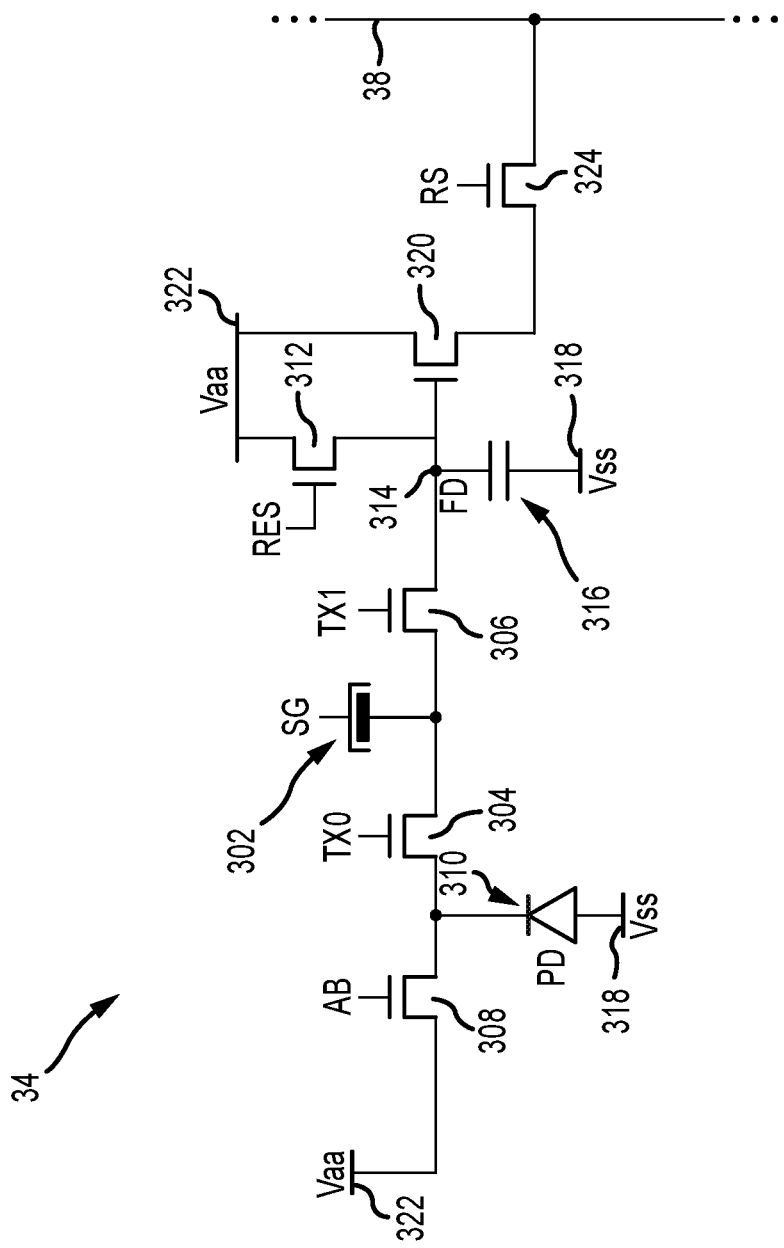
FIG. 3 is a circuit diagram of an image sensor pixel that supports global shutter readout in accordance with an embodiment.

FIG. 3 is a circuit diagram of an image sensor pixel 34 that uses a global shutter method of readout. Image sensor pixel 34 represents a global shutter pixel with a pinned photodiode 310 (PD) coupled to a charge storage gate 302 (e.g., a storage device for storing energy in the charge domain instead of the voltage domain). Alternatively, storage gate 302 may also be implemented as a storage diode. In general, storage gate 302 may be any desired type of charge storage region or charge storage node. Anti-blooming transistor 308 may be partially activated using control signal AB in order to draw away dark current that accumulates on photodiode 310. If desired, anti-blooming transistor 308 may be fully activated using control signal AB in order to reset the photodiode.

Impinging light (i.e., incident light) may generate charge in photodiode 310 in a sensor array (e.g., array 32 in FIG. 2). This charge may accumulate at photodiode 310 and may then be transferred to charge storage region 302 globally for all of the pixels at the same time by asserting control signal TX0 to activate transfer transistor 304. The readout of charge from the charge storage region 302 then proceeds in a sequential manner, row by row, by transferring charge via charge transferring transistor 306 to floating diffusion (FD) node 314 by asserting control signal TX1. Floating diffusion node 314 may have a floating diffusion capacitance 316 for storing charge. Photodiode 310, storage diode 302, and floating diffusion capacitance 316 may be coupled to ground 318. Charge transferred to floating diffusion node 314 causes the potential on this node to change and this change is sensed by the source follower transistor 320. The source terminal of the source follower transistor 320 is connected via row select transistor 324 to the sensor array column sensing line 38 that delivers the pixel signal to the periphery of the array for further processing. Control signal RS is asserted to activate row select transistor 324 to transfer the pixel signal to column sensing lines 38. After charge sensing has been completed, floating diffusion node 314 is reset to supply voltage Vaa (e.g., a nominal positive power supply voltage provided on power supply line 322) by asserting control signal RES to turn on reset transistor 312. If desired, the charge storage region 302 can be reset at the same time as floating diffusion node 314 by simultaneously turning on both transistors 306 and 312.

The global shutter image sensor pixel 34 shown in FIG. 3 is merely illustrative and is not intended to limit the scope of the present embodiments. In general, global shutter image sensor pixel 34 may include any number of charge storage regions and any number of associated charge transfer, charge resetting, readout, and selection transistors for supporting a global shutter readout operation.

Figure 4:
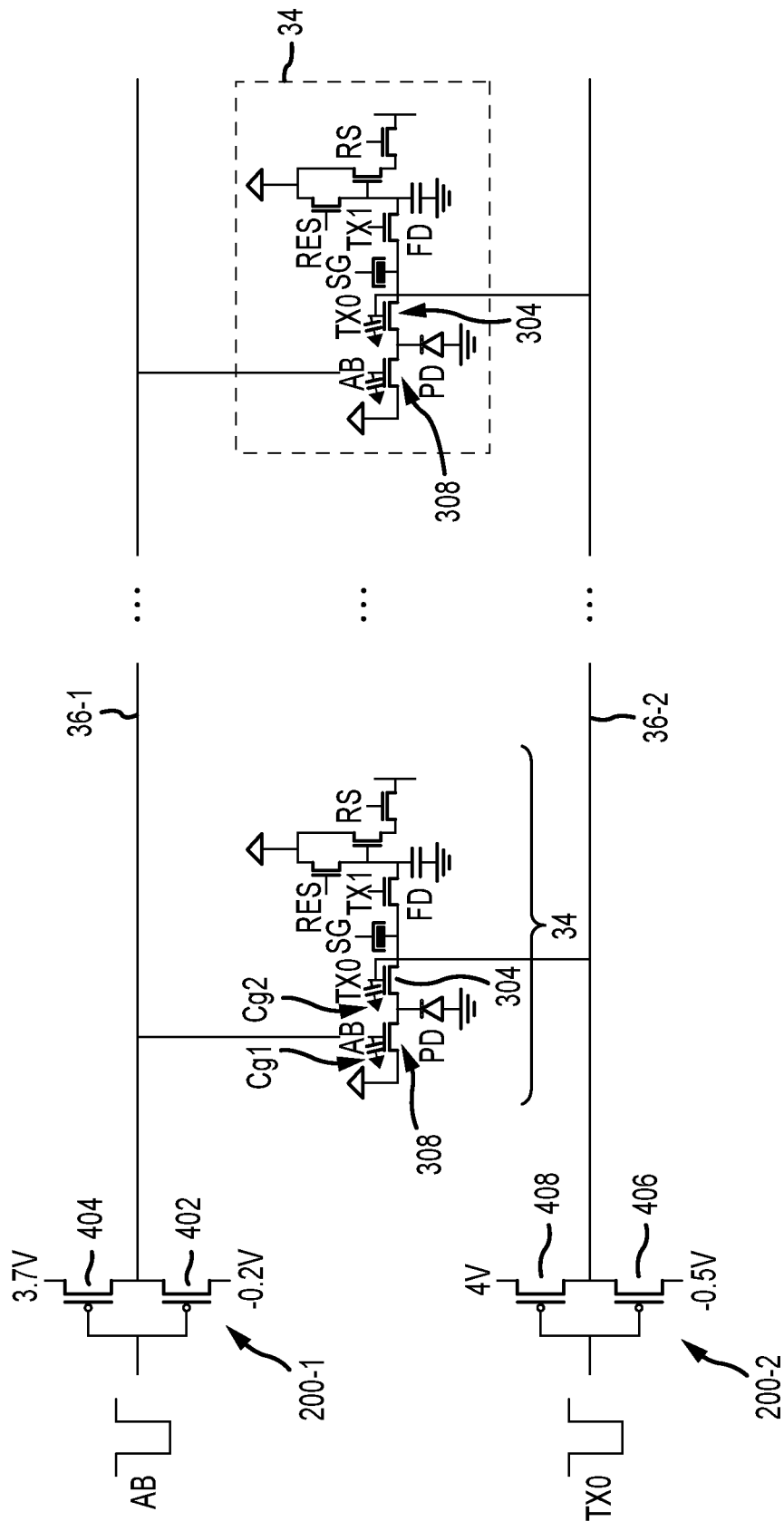
FIG. 4 is a circuit diagram showing row drivers configured to drive a row of global shutter pixels.

FIG. 4 shows a row of image pixels 34 (e.g., global shutter pixels of the type shown in connection with FIG. 3) at least partially coupled to row driver circuitry. Image pixel 34 may be a relatively large pixel (e.g., a 10 um×10 um pixel, a 20 um×20 um pixel, or larger). In such pixels, anti-blooming transistor 308 and charge transfer transistor 304 may also be relatively large devices. For instance, transistors 308 and 304 (and maybe also transistor 306) might be at least two times larger, at least five times larger, five to ten times larger, or more than ten times larger in size than transistor 312, 320, or 324. As shown in FIG. 4, all anti-blooming transistors 308 in pixels 34 arranged along a given row are configured to receive blooming control signal AB from a first row driver 200-1 via first row control line 36-1. Similarly, all charge transfer transistors 304 in pixels 34 arranged along a given row are configured to receive charge transfer control signal TX0 from a second row driver 200-2 via second row control line 36-2.

Row driver 200-1 includes a pull-up transistor 404 (e.g., a p-type metal-oxide semiconductor or PMOS transistor) that is selectively enabled to pull row line 36-1 towards a positive voltage of 3.7 V (as an example) and a pull-down transistor 402 (e.g., a n-type metal-oxide semiconductor or NMOS transistor) that is selectively activated to pull row line 36-1 down towards a negative voltage of −0.2 V (as an example). Row driver 200-1 may receive an active-low pulse at its input, which in turn provides an inverted high AB pulse at its output to temporarily turn on corresponding anti-blooming transistors 308. Similarly, row driver 200-2 includes a pull-up transistor 408 (e.g., a PMOS device) that is selectively activated to pull row line 36-2 towards a positive voltage of 4 V (as an example) and a pull-down transistor 406 (e.g., an NMOS device) that is selectively turned on to pull row line 36-2 down towards a negative voltage of −0.5 V (as an example). Row driver 200-2 may receive an active-low pulse at its input, which in turn provides an inverted high TX0 pulse at its output to temporarily turn on corresponding charge transfer transistors 304.

The simple inverter implementation of row drivers 200-1 and 200-2 shown in FIG. 4 is merely exemplary. In practice, row drivers 200-1 and 200-2 are large driver circuits formed at the periphery or edge of the image pixel array and are typically more complex. The row control circuitry (e.g., row control circuitry 40 of FIG. 2) may also include other row drivers for controlling the remaining transistors within each pixel 34 (e.g., a row driver for outputting TX2 to charge transfer transistors 306, a row driver for outputting RES to reset transistor 312, a row driver for outputting RS to row select transistor 324, etc.); these other row drivers are not shown FIG. 4 in order to avoid obscuring the present embodiments.

Furthermore, the power supply voltages for powering row drivers 200-1 and 200-2 are merely exemplary. In general, the positive voltage rail of drivers 200-1 and 200-2 may be equal or may be different with respect to one another, can be greater than voltage Vaa that powers the pixels 34, or can optionally be equal to or even lower than Vaa. Similarly, the negative voltage rail of drivers 200-1 and 200-2 may be equal or may be different with respect to one another, can be less than ground voltage Vss that powers the pixels 34, or can optionally be equal to or even greater than Vss.

As described above, transistors 308 and 304 tend to be fairly large devices having either longer gates and/or large widths. As a result, the parasitic capacitance at the gate terminals of these devices is substantial. Row driver 200-1 is configured to drive row line 36-1 that is connected to the gate terminal of each anti-blooming transistor 308 in that row. Since each anti-blooming transistor 308 along a given row presents a large parasitic gate capacitance Cg1 on line 36-1, the total capacitive loading on line 36-1 will be massive, which severely limits the speed at which row driver 200-1 can be operated and thus limits the amount by which integration time can be reduced. This limitation also applies to row driver 200-2. Row driver 200-2 is configured to drive row line 36-2 that is connected to the gate terminal of each charge transfer transistor 304 in that row. Since each charge transfer transistor 304 along a given row contributes a large parasitic gate capacitance Cg2 on line 36-2, the cumulative capacitive loading on line 36-2 will be enormous, which severely limits the speed at which row driver 200-2 can be operated and thus limits the amount by which integration time can be reduced.

Figure 5:
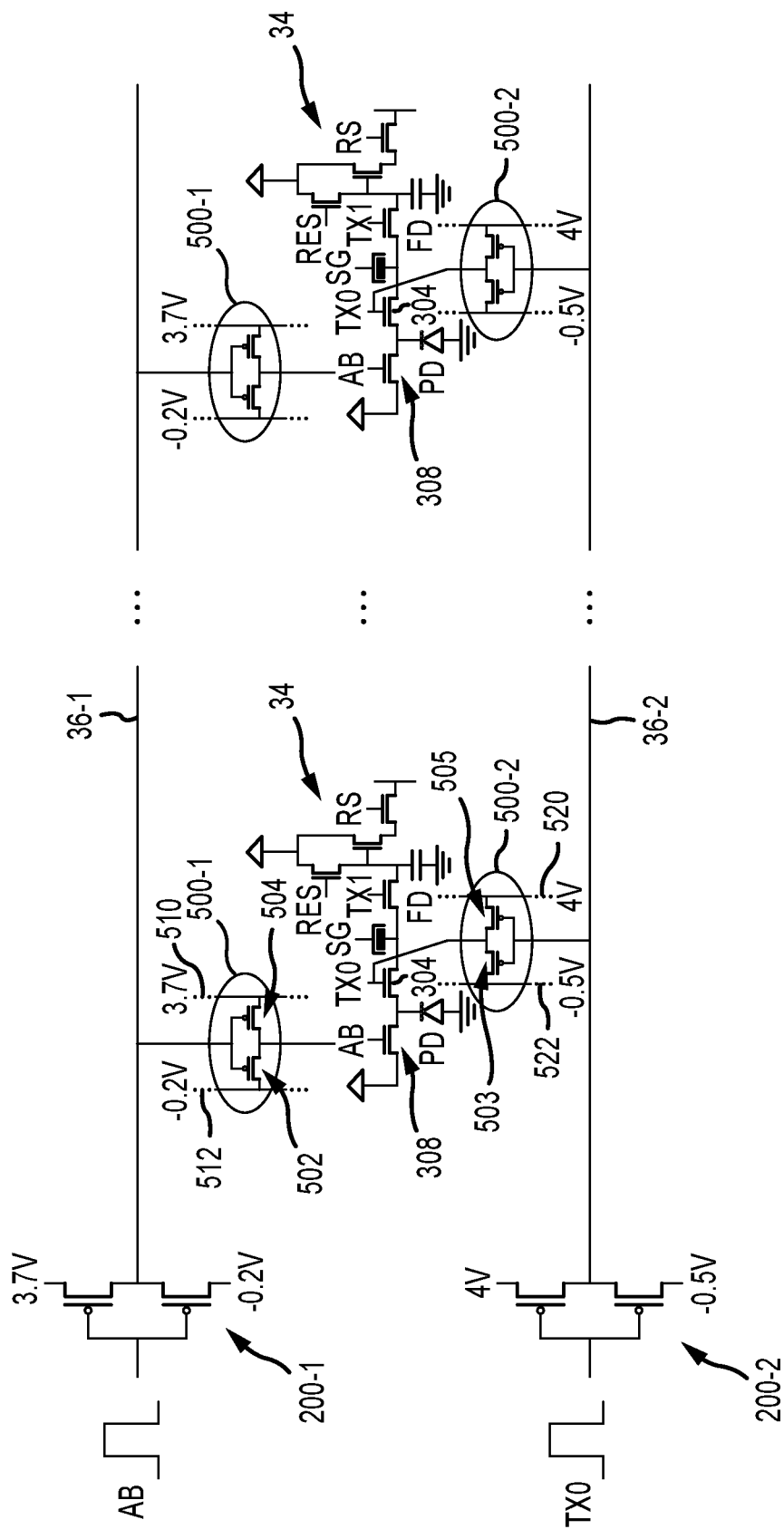
FIG. 5 is a circuit diagram showing illustrative local pixel driver circuits in accordance with an embodiment.

In accordance with an embodiment, each image pixel 34 may be provided with local pixel driver circuits to help reduce the total amount of capacitive loading on one or more of the row control lines (see, e.g., FIG. 5, where each image pixel 34 is provided with its own set of local pixel drivers 500-1 and 500-2).

As shown in FIG. 5, a local pixel driver 500-1 may be formed between row line 36-1 and a corresponding anti-blooming transistor 308. Unlike row driver 200-1, which is formed at the peripheral edge of the image pixel array, local pixel driver 500-1 is formed locally within each image pixel 34 (e.g., local pixel driver 500-1 is formed in the immediate physical proximity of the associated photodiode PD and pixel transistors 304, 306, 308, 312, 320, and 324). Local pixel driver 500-1 may include a pull-down transistor 502 (e.g., an n-channel transistor such as an NMOS device) and a pull-up transistor 504 (e.g., a p-channel transistor such as a PMOS device) coupled in series between local power lines 510 and 512. Configured in this way, n-channel transistor 502 may be selectively activated to pull signal AB down towards −0.2 V (or whatever voltage local power line 512 is biased to), whereas p-channel transistor 504 may be selectively enabled to pull signal AB up towards 3.7 V (or whatever voltage local power line 510 is biased to). The local power lines 510 and 512 are generally biased to the same high and low voltage levels as those used to power row driver 200-1, but this need not be the case.

The current for controlling or driving the highly parasitic anti-blooming gate terminal will be delivered using local power lines 510 and 512 (e.g., static "vertical" power supply wires that are shared between pixels arranged along the same column) instead of using the power supply terminals of peripheral row driver 200-1. In other words, the local power lines 510 and 512 run perpendicular or orthogonal to the row control lines. The size of local driver transistors 502 and 504 should also be much smaller than that of anti-blooming transistor 308. For instance, the size of local driver transistors 502 and 504 may be at least two times smaller, two to five times smaller, at least five times smaller, five to ten times smaller, or more than ten times smaller than anti-blooming transistor 308. Thus, the collective parasitic capacitance along row line 36-1 is significantly reduced. Configured in this way, local pixel driver 500-1 effectively isolates the heavy parasitic loading of the anti-blooming gate from row line 36-1, which significantly reduces the overall capacitive loading on horizontal control wire 36-1. Using the local pixel drivers to effectively decouple the highly parasitic anti-blooming gate in this way (which moves the integration control structure locally inside that image pixel 34) can dramatically improve the speed at which row driver 200-1 can be operated and thus allow integration time to be minimized.

Similarly, a local pixel driver 500-2 may be formed between row line 36-2 and a corresponding charge transfer transistor 304. Unlike row driver 200-2, which is formed at the peripheral edge of the image pixel array, local pixel driver 500-2 is formed locally within each image pixel 34 (e.g., local pixel driver 500-2 is formed in the immediate physical proximity of the associated photodiode PD and pixel transistors 304, 306, 308, 312, 320, and 324). Local pixel driver 500-2 may include pull-down transistor 503 (e.g., an n-channel transistor such as an NMOS device) and pull-up transistor 505 (e.g., a p-channel transistor such as a PMOS device) coupled in series between local power lines 520 and 522. Configured in this way, n-channel transistor 503 may be selectively activated to pull signal TX0 down towards −0.5 V (or whatever voltage local power line 522 is biased to), whereas p-channel transistor 505 may be selectively enabled to pull signal TX0 up towards 4 V (or whatever voltage local power line 520 is biased to). The local power lines 520 and 522 are generally biased to the same high and low voltage levels as those used to power row driver 200-2, but this need not be the case.

The current for controlling or driving the highly parasitic charge transfer gate terminal will be delivered using local power lines 520 and 522 (e.g., static "vertical" power supply wires that are shared between pixels arranged along the same column) instead of using the power supply terminals of peripheral row driver 200-2, which moves the integration control structure locally inside that image pixel 34. The size of local pixel driver transistors 503 and 505 should also be much smaller than that of charge transfer transistor 304. For instance, the size of local driver transistors 503 and 505 may be at least two times smaller, two to five times smaller, at least five times smaller, five to ten times smaller, or more than ten times smaller than charge transfer transistor 304. Thus, the collective parasitic capacitance along row line 36-2 is significantly reduced. Configured in this way, local pixel driver 500-2 effectively decouples the heavy parasitic loading of the charge transfer gate from row line 36-2, which significantly reduces the overall capacitive loading on horizontal control wire 36-2. Using the local pixel drivers to effectively isolate the highly parasitic charge transfer gate in this way can dramatically improve the speed at which row driver 200-2 is operated and thus allow integration time to be minimized.

Figure 6:
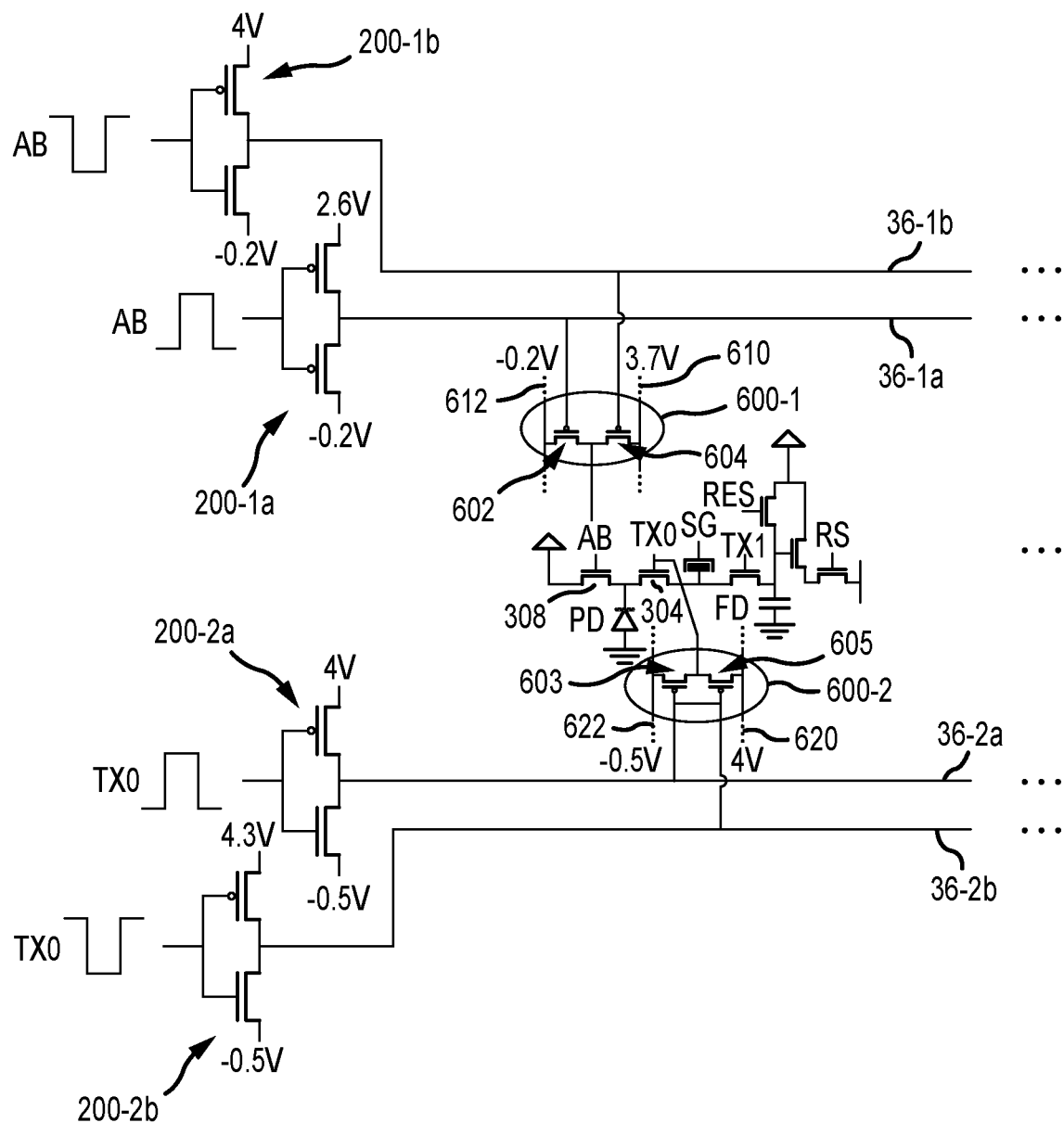
FIG. 6 is a circuit diagram showing illustrative local pixel driver circuits formed using only n-channel devices in accordance with an embodiment.

The example of FIG. 5 in which the local pixel drivers include p-channel transistors is merely illustrative. In other suitable arrangements, it may be desirable to only include n-channel transistors within each pixel 34 without use of any p-channel transistors within the image pixel array. FIG. 6 shows another suitable embodiment where the local pixel driver circuits include only n-channel transistors without any p-channel transistors.

As shown in FIG. 6, two separate peripheral row drivers are needed for driving local pixel driver 600-1: a first row driver 200-1a for driving row line 36-1a and a second row driver 200-1b for driving row line 36-1b. Local pixel driver 600-1 may be formed between row lines 36-1a/36-1b and a corresponding anti-blooming transistor 308. Unlike row drivers 200-1a/b, which are formed at the peripheral border of the image pixel array, local pixel driver 600-1 is formed locally within each image pixel 34 (e.g., local pixel driver 600-1 is formed in the immediate physical proximity of the associated photodiode PD and pixel transistors 304, 306, 308, 312, 320, and 324). Local pixel driver 600-1 may include a pull-down transistor 602 (e.g., an n-channel transistor such as an NMOS device) and a pull-up transistor 604 (e.g., an n-channel transistor such as an NMOS device) coupled in series between the local power lines 610 and 612. Configured in this way, n-channel transistor 602 may be selectively activated using driver 200-1a to pull signal AB down towards −0.2 V (or whatever voltage local power line 612 is biased to), whereas n-channel transistor 604 may be selectively enabled using driver 200-1b to pull signal AB up towards 3.7 V (or whatever voltage local power line 610 is biased to). Local power line 610 may be biased to a voltage less than the positive voltage level of row driver 200-1b (since n-channel transistor 604 will have to be overdriven as a pull-up transistor), whereas local power line 612 is generally biased to the same low voltage level as that used to power row driver 200-1a, but this need not be the case.

The current for controlling or driving the highly parasitic anti-blooming gate terminal will be delivered using local power lines 610 and 612 (e.g., static "vertical" power supply wires that are shared between pixels arranged along the same column) instead of using the power supply terminals of peripheral row driver 200-1a/b. In other words, the local power lines 610 and 612 run perpendicular or orthogonal to the row control lines. The size of local driver n-channel transistors 602 and 604 should also be much smaller than that of anti-blooming transistor 308. For instance, the size of local driver transistors 602 and 604 may be at least two times smaller, two to five times smaller, at least five times smaller, five to ten times smaller, or more than ten times smaller than anti-blooming transistor 308. Thus, the collective parasitic capacitance along row lines 36-1a and 36-1b is significantly reduced. Configured in this way, local pixel driver 600-1 effectively isolates the heavy parasitic loading of the anti-blooming gate from row lines 36-1a/b, which significantly reduces the overall capacitive loading on the horizontal control wires. This dramatically improves the speed at which row drivers 200-1a/b operate and thus allows integration time to be minimized.

Still referring to FIG. 6, two separate peripheral row drivers are needed for driving local pixel driver 600-2: a first row driver 200-2a for driving row line 36-2a and a second row driver 200-2b for driving row line 36-2b. Unlike row drivers 200-2a/b, which are formed at the peripheral border of the image pixel array, local pixel driver 600-2 is formed locally within each image pixel 34 (e.g., local pixel driver 600-2 is formed in the immediate physical proximity of the associated photodiode PD and pixel transistors 304, 306, 308, 312, 320, and 324). Local pixel driver 600-2 may be formed between row lines 36-2a/36-2b and a corresponding charge transfer transistor 304. Local pixel driver 600-2 may include a pull-down transistor 603 (e.g., an n-channel transistor such as an NMOS device) and a pull-up transistor 605 (e.g., an n-channel transistor such as an NMOS device) coupled in series between the local power lines 620 and 622. Configured in this way, n-channel transistor 603 may be selectively activated using driver 200-2a to pull signal TX0 down towards −0.5 V (or whatever voltage local power line 622 is biased to), whereas n-channel transistor 605 may be selectively enabled using driver 200-2b to pull signal TX0 up towards 4 V (or whatever voltage local power line 620 is biased to). Local power line 620 may be biased to a voltage less than the positive voltage level of row driver 200-2b (since n-channel transistor 605 will have to be overdriven as a pull-up transistor), whereas local power line 622 is generally biased to the same low voltage level as that used to power row driver 200-2a, but this need not be the case.

The current for controlling or driving the highly parasitic charge transfer gate terminal will be delivered using local power lines 620 and 622 (e.g., static "vertical" power supply wires that are shared between pixels arranged along the same column) instead of using the power supply terminals of peripheral row driver 200-2a/b. The size of local driver n-channel transistors 603 and 605 should also be much smaller than that of charge transfer transistor 304. For instance, the size of local driver transistors 603 and 605 may be at least two times smaller, two to five times smaller, at least five times smaller, five to ten times smaller, or more than ten times smaller than transistor 304. Thus, the collective parasitic capacitance along row lines 36-2a and 36-2b is significantly reduced. Configured in this way, local pixel driver 600-2 effectively isolates the heavy parasitic loading of the charge transfer gate from row lines 36-2a/b, which significantly reduces the overall capacitive loading on the horizontal control wires. This dramatically improves the speed at which row drivers 200-2a/b operate and thus allows integration time to be minimized.

Figure 7:
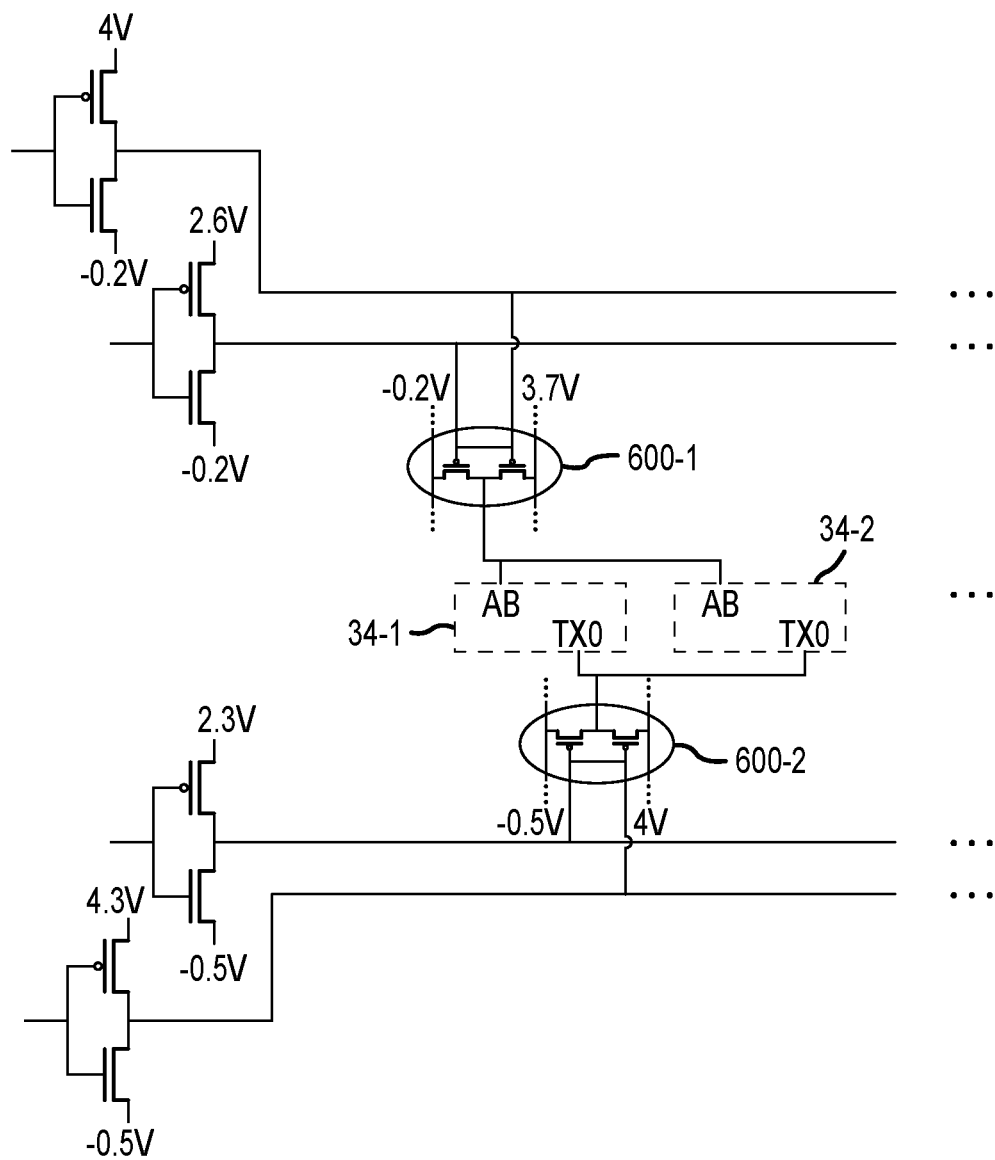
FIG. 7 is a circuit diagram showing how local pixel driver circuits can be shared with adjacent image pixels in accordance with an embodiment.

The embodiments of FIGS. 5 and 6 in which each image pixel 34 is provided with four additional local pixel driver transistors (e.g., transistors 502-505 in FIG. 5 and transistors 602-606 in FIG. 6) is merely illustrative. In certain embodiments, the local pixel driver circuits may be shared between adjacent image pixels 34 (see FIG. 7). As shown in FIG. 7, adjoining image pixels 34-1 and 34-2 have anti-blooming gates driven by a common local pixel driver 600-1 and charge transfer gates driven by a common local pixel driver 600-2. Sharing local pixel drivers between neighboring pixels in this way can help reduce the total area of the image pixel array. In general, local pixel drivers may be shared among N adjacent image pixels, where N is two, three, four, five, six, seven, eight, or any integer greater than one to optimize both performance and area.

Figure 8:
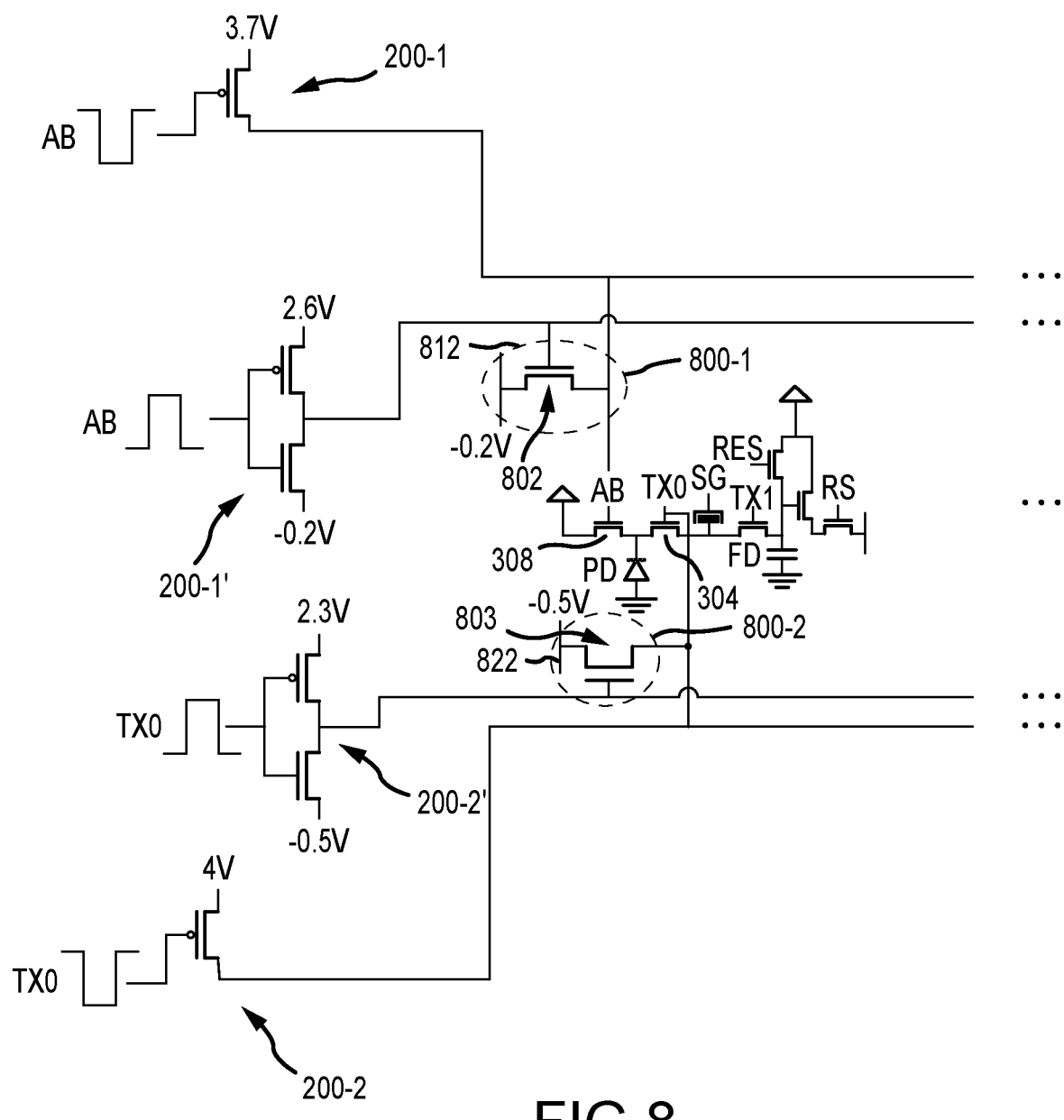
FIG. 8 is a circuit diagram showing illustrative local pixel driver circuits targeted to improving the speed of falling edges in accordance with an embodiment.

The local pixel drivers in the embodiments of FIGS. 5 and 6 optimize both the rising and falling edge of signals AB and TX0. If desired, the local pixel drivers may optionally be optimized to focus on only the rising edge or the falling edge of signals AB and TX0. FIG. 8 is a circuit diagram showing illustrative local pixel driver circuits targeted to improving the speed of falling edges. As shown in FIG. 8, the gate terminal of the anti-blooming transistor 308 may be driven by peripheral row driver 200-1. Moreover, pixel 34 may be provided with local pixel driver 800-1. Local pixel driver 800-1 may include only a pull-down transistor 802 (e.g., an n-channel transistor such as an NMOS device) coupled to local power line 812. Configured in this way, n-channel transistor 802 may be selectively activated using driver 200-1' to pull signal AB down towards −0.2 V (or whatever voltage local power line 812 is biased to). Local power line 812 is generally biased to the same low voltage level as that used to power row driver 200-1', but this need not be the case. Since transistor 802 already provides the pull-down capability, peripheral row driver 200-1 may include only a pull-up p-channel device. Configured in this way, local pixel driver 800-1 can help improve the fall-time of signal AB.

Similarly, the gate terminal of the charge transfer transistor 304 may be driven by peripheral row driver 200-2. Moreover, pixel 34 may be provided with local pixel driver 800-2. Local pixel driver 800-2 may include only a pull-down transistor 803 (e.g., an n-channel transistor such as an NMOS device) coupled to local power line 822. Configured in this way, n-channel transistor 803 may be selectively enabled using driver 200-2' to pull signal TX0 down towards −0.5 V (or whatever voltage local power line 822 is biased to). Local power line 822 is generally biased to the same low voltage level as that used to power row driver 200-2', but this need not be the case. Since transistor 803 already provides the pull-down capability, peripheral row driver 200-2 may include only a pull-up p-channel device. Configured in this way, local pixel driver 800-2 can help improve the fall-time of signal TX0.

The example of FIG. 8 in which local pixel driver circuits 800-1 and 800-2 are used to improve the speed of the falling edge of AB and TX0 is merely illustrative and is not intended to limit the scope of the present embodiments. If desired, the image sensor may be provided local pixel driver circuits for improving the rising edge of one or more row control signals. If desired, the one-sided (or asymmetric) local pixel drivers of the type shown in FIG. 8 can also be shared among neighboring pixels.

The embodiments described herein can help reduce integration time, especially for large image pixels supporting global shutter operation. If desired, however, the techniques described in connection with FIGS. 5-8 can also be extended to rolling shutter image sensor pixels to improve readout operations.

In various embodiments, an image sensor is provided that includes an array of image pixels (e.g., an array of global shutter image sensor pixels), a row driver circuit formed at the periphery of the array, where the row driver circuit is configured to provide a row control signal to a given row of image pixels in the array via a row control line, and a plurality of local pixel driver circuits configured to receive signals from the row driver circuit via the row control line, to provide corresponding signals to the given row of image pixels, and to reduce the total amount of capacitive loading on the row control line. Each image pixel in the array may include a photosensitive element and a transistor coupled to the photosensitive element, where the transistor receives the row control signal from one of the plurality of local pixel driver circuits. Each of the plurality of local pixel driver circuits may include a pull-down transistor and/or a pull-up transistor that is smaller than the transistor in each of the image pixels in the given row. Each local pixel driver circuit may be shared by two or more image pixels in the given row to reduce area.

In various embodiments, circuitry is provided that includes a row driver circuit configured to drive a row line, an image pixel having a charge transfer transistor with a gate terminal that receives control signals from the row line, and a local pixel driver circuit coupled between the row line and the gate terminal of the charge transfer transistor. The local pixel driver circuit may include a pull-down transistor directly connected to a first local power supply column line that runs orthogonal to the row line and/or a pull-up transistor directly connected to a second local power supply column line that runs orthogonal to the row line. If desired, the local pixel driver circuit may include only one pull-down transistor configured to improve the fall time of the control signals received at the gate terminal of the charge transfer transistor or only one pull-up transistor configured to improve the rise time of the control signals received at the gate terminal of the charge transfer transistor.

The foregoing is merely illustrative of the principles of this invention and various modifications can be made by those skilled in the art without departing from the scope and spirit of the invention. The foregoing embodiments may be implemented individually or in any combination.

What is claimed is:

1. An image sensor, comprising:
    an array of image pixels;
    a row driver circuit formed at the periphery of the array, wherein the row driver circuit is configured to provide a row control signal to a given row of image pixels in the array via a row control line; and
    a plurality of local pixel driver circuits configured to receive signals from the row driver circuit via the row control line, to provide corresponding signals to the given row of image pixels, and to reduce the total amount of capacitive loading on the row control line.

2. The image sensor of claim 1, wherein each image pixel in the given row of image pixels in the array comprises:
    a photosensitive element; and
    a transistor coupled to the photosensitive element, wherein the transistor receives the row control signal from one of the plurality of local pixel driver circuits.

3. The image sensor of claim 2, wherein each of the plurality of local pixel driver circuits comprises a pull-down transistor that is smaller than the transistor in each of the image pixels in the given row.

4. The image sensor of claim 3, wherein the pull-down transistor in each of the plurality of local pixel driver circuits is at least two times smaller than the transistor in each of the image pixels in the given row.

5. The image sensor of claim 3, wherein the pull-down transistor in each of the plurality of local pixel driver circuits is at least five to ten times smaller than the transistor in each of the image pixels in the given row.

6. The image sensor of claim 3, wherein the pull-down transistor in each of the plurality of local pixel driver circuits is directly connected to a local column power supply line that runs perpendicular to the row control line.

7. The image sensor of claim 3, wherein each of the plurality of local pixel driver circuits further comprises a pull-up transistor that is smaller than the transistor in each of the image pixels in the given row.

8. The image sensor of claim 7, wherein the pull-down transistor and the pull-up transistor are both n-channel transistors.

9. The image sensor of claim 7, wherein the pull-down transistor is an n-channel transistor, and wherein the pull-up transistor is a p-channel transistor.

10. The image sensor of claim 7, wherein the pull-up transistor in each of the plurality of local pixel driver circuits is at least two times smaller than the transistor in each of the image pixels in the given row.

11. The image sensor of claim 7, wherein the pull-up transistor in each of the plurality of local pixel driver circuits is five to ten times smaller than the transistor in each of the image pixels in the given row.

12. The image sensor of claim 7, wherein the pull-up transistor in each of the plurality of local pixel driver circuits is directly connected to a local column power supply line that runs orthogonal to the row control line.

13. The image sensor of claim 2, wherein each image pixel in the given row of image pixels in the array further comprises:
    an additional transistor coupled to the photosensitive element, wherein the transistor is an anti-blooming transistor that is at least two times larger than the additional transistor.

14. The image sensor of claim 2, wherein each image pixel in the given row of image pixels in the array further comprises:
    an additional transistor coupled to the photosensitive element, wherein the transistor is a charge transfer transistor that is at least two times larger than the additional transistor.

15. The image sensor of claim 1, wherein each local pixel driver circuit in the plurality of local pixel driver circuits is shared by at least two image pixels in the given row to reduce area.

16. Circuitry, comprising:
    a row driver circuit configured to drive a row line;
    an image pixel having a charge transfer transistor, wherein the charge transfer transistor has a gate terminal configured to receive control signals from the row line; and
    a local pixel driver circuit coupled between the row line and the gate terminal of the charge transfer transistor.

17. The circuitry of claim 16, wherein the local pixel driver circuit comprises:
    a pull-down transistor directly connected to a first local power supply column line that runs orthogonal to the row line; and
    a pull-up transistor directly connected to a second local power supply column line that runs orthogonal to the row line.

18. The circuitry of claim 16, wherein the local pixel driver circuit includes only one pull-down transistor configured to improve the fall time of the control signals received at the gate terminal of the charge transfer transistor or only one pull-up transistor configured to improve the rise time of the control signals received at the gate terminal of the charge transfer transistor.

19. The circuitry of claim 17, wherein the charge transfer transistor is at least five times larger than the pull-down transistor in the local pixel driver circuit.

20. An image sensor, comprising:
    a row driver configured to drive a row line;
    a row of global shutter image pixels configured to receive row control signals from the row line; and
    a local pixel driver interposed between the row line and the row of global shutter image pixels, wherein the local pixel driver is shared between at least two image pixels in the row of global shutter image pixels.

* * * * *